United States Patent
Fekih-Romdhane et al.

(10) Patent No.: US 7,230,858 B2
(45) Date of Patent: Jun. 12, 2007

(54) DUAL FREQUENCY FIRST-IN-FIRST-OUT STRUCTURE

(75) Inventors: Khaled Fekih-Romdhane, Houston, TX (US); Skip Shizhen Liu, Clackamas, OR (US); Peter Chlumecky, Sugar Land, TX (US)

(73) Assignee: Infineon Technologies AG, Munich (DE)

( * ) Notice: Subject to any disclaimer, the term of this patent is extended or adjusted under 35 U.S.C. 154(b) by 103 days.

(21) Appl. No.: 11/168,818

(22) Filed: Jun. 28, 2005

(65) Prior Publication Data

US 2007/0011363 A1    Jan. 11, 2007

(51) Int. Cl.
    *G11C 7/00*    (2006.01)
(52) U.S. Cl. .................... 365/189.05; 365/219

(58) Field of Classification Search ............... 365/219
    See application file for complete search history.

(56) References Cited

U.S. PATENT DOCUMENTS

| | | | | |
|---|---|---|---|---|
| 4,429,300 | A * | 1/1984 | Yamasawa et al. | 341/100 |
| 5,543,791 | A * | 8/1996 | Riggio, Jr. | 341/101 |
| 6,335,696 | B1 * | 1/2002 | Aoyagi et al. | 341/100 |
| 6,337,826 | B1 * | 1/2002 | Imai et al. | 365/221 |
| 6,427,197 | B1 * | 7/2002 | Sato et al. | 711/169 |
| 6,563,485 | B2 * | 5/2003 | Ho et al. | 345/100 |
| 6,600,691 | B2 * | 7/2003 | Morzano et al. | 365/219 |

* cited by examiner

*Primary Examiner*—Tan T. Nguyen
(74) *Attorney, Agent, or Firm*—Patterson & Sheridan, L.L.P.

(57) ABSTRACT

Techniques and circuitry for transferring data from memory arrays of a memory device to output pins via a FIFO structure are provided. Input and output stages of the FIFO structure may be operated independently, allowing data to be loaded into the FIFO structure at a first frequency and unloaded from the FIFO structure at a second frequency.

24 Claims, 11 Drawing Sheets

DUAL FREQUENCY FIRST-IN-FIRST-OUT STRUCTURE

BACKGROUND OF THE INVENTION

1. Field of the Invention

The invention generally relates to accessing memory devices and, more particularly, to transferring data from memory arrays to external data pads of memory devices, such as doubled data rate (DDR) dynamic random access memory (DRAM) devices.

2. Description of the Related Art

The evolution of sub-micron CMOS technology has resulted in an increasing demand for high-speed semiconductor memory devices, such as dynamic random access memory (DRAM) devices, pseudo static random access memory (PSRAM) devices, and the like. Herein, such memory devices are collectively referred to as DRAM devices.

Some types of DRAM devices have a synchronous interface, generally meaning that data is written to and read from the devices in conjunction with a clock pulse. Early synchronous DRAM (SDRAM) devices transferred a single bit of data per clock cycle (e.g., on a rising edge) and are appropriately referred to as single data rate (SDR) SDRAM devices. Later developed double-data rate (DDR) SDRAM devices included input/output (I/O) buffers that transfer a bit of data on both rising and falling edges of the clock signal, thereby doubling the effective data transfer rate. Still other types of SDRAM devices, referred to as DDR-II SDRAM devices, transfer two bits of data on each clock edge, typically by operating the I/O buffers at twice the frequency of the clock signal, again doubling the data transfer rate (to 4× the SDR data transfer rate).

Data read out from such DDR devices is often held in first-in first-out (FIFO) structures that receive the data from the memory arrays and drive the data out onto external data lines. Input and output pointers are typically used to determine (or "point to") a FIFO location to which data is to be input to or output from the FIFO, respectively. These pointers are typically derived from a DATA_READY signal that is essentially generated as a prediction of when the data should be valid at the FIFO, based on predicted delay through components in the data path. The output pointers ensure the synchronous requirements of data output from the DRAM are satisfied.

Timing of the input pointer signals is critical, as these signals control the latching of data into the FIFOs. If these pointer signals arrive too early, they can close the latches before the data signals are valid at the FIFOs. On the other hand, if these pointer signals arrive too late, these signals could latch data from a following READ access instead of the data from the current READ access. In conventional devices, data is input into the FIFOs at the same rate it is output onto the external data lines. As a result, input pointers are changed at the same rate as output pointers. Unfortunately, as operating speeds increase for DDR (and later generation) DRAM devices, it becomes more and more difficult to meet input pointer timing requirements.

Accordingly, there is a need for an improved methods and apparatus for operating data FIFOs to transfer data from DRAM memory arrays to external data pads.

SUMMARY OF THE INVENTION

Embodiments of the present invention generally provide methods and apparatus for operating DRAM FIFOs.

One embodiment provides a memory device generally including one or more memory arrays, external data pads and, for each external data pad, a first-in first-out (FIFO) structure. Each FIFO structure generally includes an input stage configured to transfer a plurality of bits of data in parallel from the memory arrays to a plurality of latch elements identified by an input pointer signal adjusted at a core frequency and an output stage configured to transfer bits of data sequentially from the latch elements identified by an output pointer signal adjusted at a data frequency that is at least twice the core frequency.

Another embodiment provides a dynamic random access memory (DRAM) device generally including one or more memory arrays, external data pads and, for each external data pad, a first-in first-out (FIFO) structure. Each FIFO structure generally includes an input stage configured to transfer a plurality of bits of data in parallel from the memory arrays to a plurality of latch elements in conjunction with a DATA_READY signal and an output stage configured to transfer at least one bit of data from the latch elements on each edge of a data clock signal.

Another embodiment provides a dynamic random access memory (DRAM) device generally including one or more memory arrays, external data pads and, for each external data pad, a first-in first-out (FIFO) structure. Each FIFO structure generally includes a first-in first-out (FIFO) structure having an input stage configured to transfer a plurality of bits of data in parallel from the memory arrays to a plurality of latch elements and an output stage configured to sequentially transfer at least one bit of data from the latch elements on each edge of a data clock signal to the external data pad, input pointer generation circuitry configured to generate, in conjunction with a DATA_READY signal an input pointer signal to determine the plurality of latch elements to which the input stage stores the plurality of bits of data in parallel, and output pointer generation circuitry configured to generate, in conjunction with the data clock signal an output pointer signal to determine the latch elements from which the output stage transfers the at least one bit of data.

Another embodiment provides a method of operating a first-in first-out (FIFO) structure to transfer data from one or more memory arrays of a memory device to an external data pad of the memory device. The method generally includes transferring multiple bits of data from the memory arrays to the FIFO structure in parallel, in conjunction with a DATA_READY signal, and transferring multiple bits of data from the FIFO structure to the data pad, sequentially, in conjunction with a data clock signal, wherein the data clock signal has a corresponding frequency that is at least twice a corresponding frequency of the DATA_READY signal.

Another embodiment provides a method of operating a first-in first-out (FIFO) structure to transfer data from one or more memory arrays of a memory device to an external data pad of the memory device. The method generally includes generating an input pointer in conjunction with a DATA_READY signal indicating data to be transferred from the memory arrays to the FIFO structure is available, transferring multiple bits of data from the memory arrays to the FIFO structure in parallel, in conjunction with a DATA_READY signal, wherein the multiple bits of data transferred to the FIFO structure are stored in latch elements identified by the input pointer, and generating an output pointer in conjunction with a data clock signal, and transferring multiple bits of data from the FIFO structure to the data pad, sequentially, in conjunction with the data clock signal, wherein the multiple bits of data transferred from the FIFO structure are transferred from latch elements identified by the output pointer.

Another embodiment provides a dynamic random access memory (DRAM) device. The DRAM device generally includes one or more memory arrays, external data pads and, for each external data pad, data exchange means. Each data exchange means generally includes an input stage configured to transfer a plurality of bits of data in parallel from the memory arrays to a plurality of latch means in conjunction with a DATA_READY signal and an output stage configured to transfer at least one bit of data from the latch means to a corresponding data pad on each edge of a data clock signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide techniques and circuitry for transferring data from memory arrays of a memory device to output pins via a FIFO structure. Input and output stages of the FIFO structure may be operated independently, allowing data to be loaded into the FIFO structure at a first frequency and unloaded from the FIFO structure at a second frequency. As an example, data may be loaded into the FIFO structures form memory arrays at a core clock frequency, while data may be output from the FIFO structure to data pins at a higher data clock frequency (e.g., the data clock frequency may be 2× or more the core clock frequency). By processing data through the FIFO structure at different input and output frequencies, reductions in signal latency may be achieved, leading to improved signal integrity and operating speed.

An Exemplary Memory Device With a Dual Frequency FIFO

Figure 1:
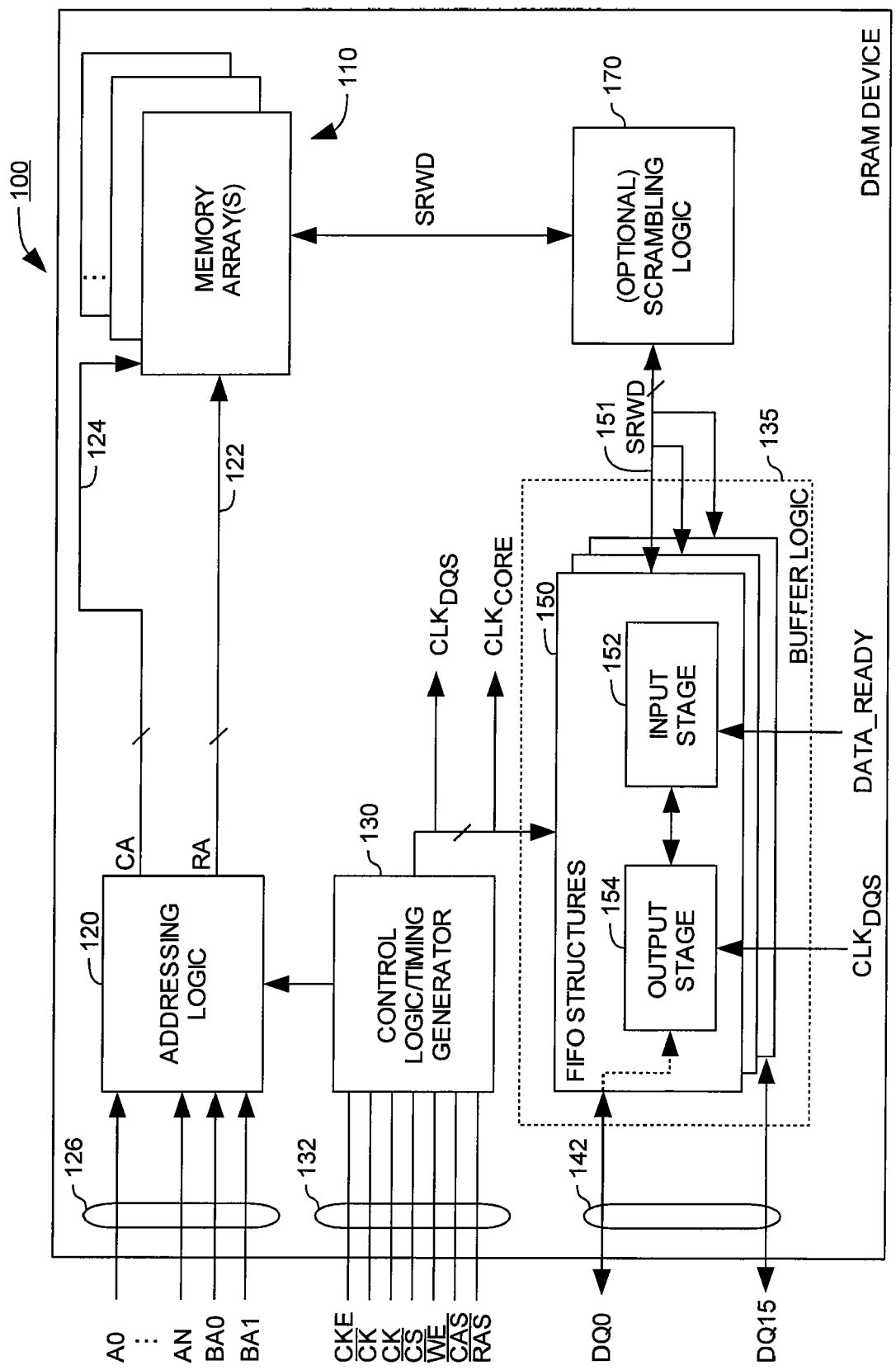
FIG. 1 illustrates a dynamic random access memory (DRAM) device in accordance with embodiments of the present invention.

FIG. 1 illustrates an exemplary memory device 100 (e.g., a DRAM device) utilizing a dual-frequency FIFO structure in accordance with one embodiment of the present invention, to access data stored in one or more memory arrays (or banks, commonly referred to collectively as the memory core) 110.

As illustrated, the device 100 may include control logic 130 to receive a set of control signals 132 to access (e.g., read, write, or refresh) data stored in the arrays 110 at locations specified by a set of address signals 126. The address signals 126 may be latched in response to signals 132 and converted into row address signals (RA) 122 and column address signals (CA) 124 used to access individual cells in the arrays 110 by addressing logic 120.

Data presented as data signals (DQ0–DQ15) 142 read from and written to the arrays 110 may be transferred between external data pads and the arrays 110 via I/O buffering logic 135. As illustrated, data may be transferred between the arrays 110 and the I/O buffering logic 135, via a bus of data lines referred to as spine read/write data (SRWD) lines 151 (which may be output from optional scrambling logic 170). Assuming a total of 16 external data pads DQ<15:0>, there may be 64 total SRWD lines 151 for a DDR-II device (32 for a DDR-I device and 128 for DDR-III).

Therefore, the readout of data from the memory arrays 110 may include operations for serializing a number of bits received in parallel for output on the external data pads. As an example, assuming the "x16" device illustrated, 64 bits of data may be retrieved from the arrays 110, in each read access, and loaded as 4-bits to a FIFO structure 150 provided for each external data pad. The 64 bits of data may then be output from the FIFO structures 150 as 16 bits (one for each data pad) on each edge of consecutive data clock signals. For "x4" or "x8" devices, data may be output in a similar manner, as 4 or 8 bits, respectively, on each edge of consecutive data clock signals.

As illustrated, for some embodiments, only an output stage 154 of each FIFO structure 150 may be operated at the data clock ($CLK_{DQS}$) frequency (typically twice the external clock frequency for DDR-II), while an input stage 152 may be operated via a DATA_READY having a maximum frequency corresponding to a slower memory core clock signal ($CLK_{CORE}$, typically ½ the external clock frequency). In other words, the input stage 152 may be operated at ¼ the speed of the output stage 154.

Figure 2:
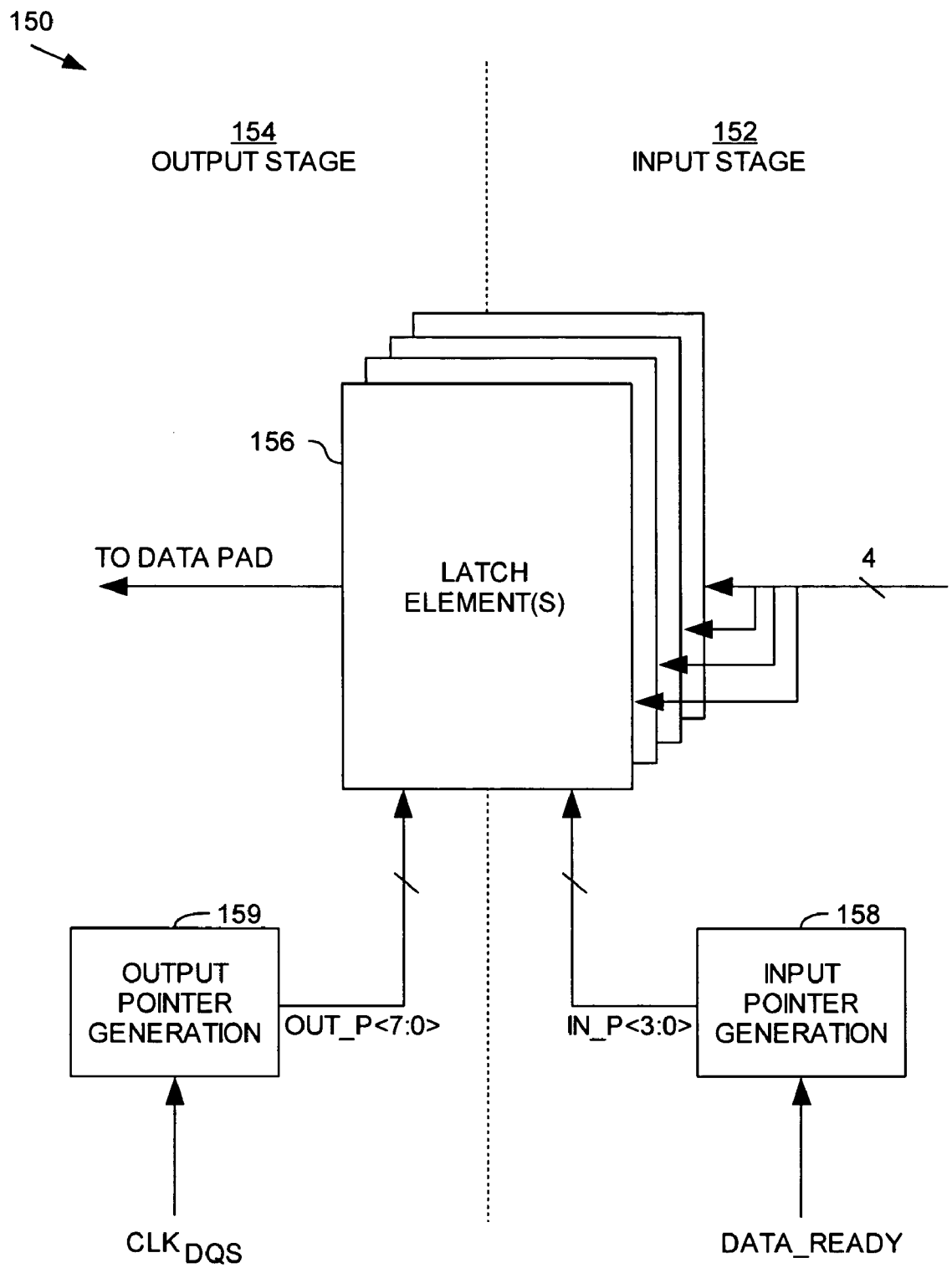
FIG. 2 illustrates an exemplary FIFO structure in accordance with embodiments of the present invention.

As illustrated in FIG. 2, the input stage 152 of the FIFO structure 150 may include input pointer generation circuit 158 driven by the DATA_READY signal. The input pointer generation circuit 158 may produce an input pointer signal, illustrated as a 4-bit signal IP<3:0>, that selects ("points to") a set of latch elements 156 of the FIFO structure 150 in which data read from memory arrays can be held prior to output on external data pads. Similarly, the output stage 154 may include output pointer generation circuit 159 driven by the data clock signal, to produce an output pointer signal, illustrated as an 8-bit signal OP<7:0>, that points to a single latch element 156 from which data may be output to an external data pad.

Figure 3:
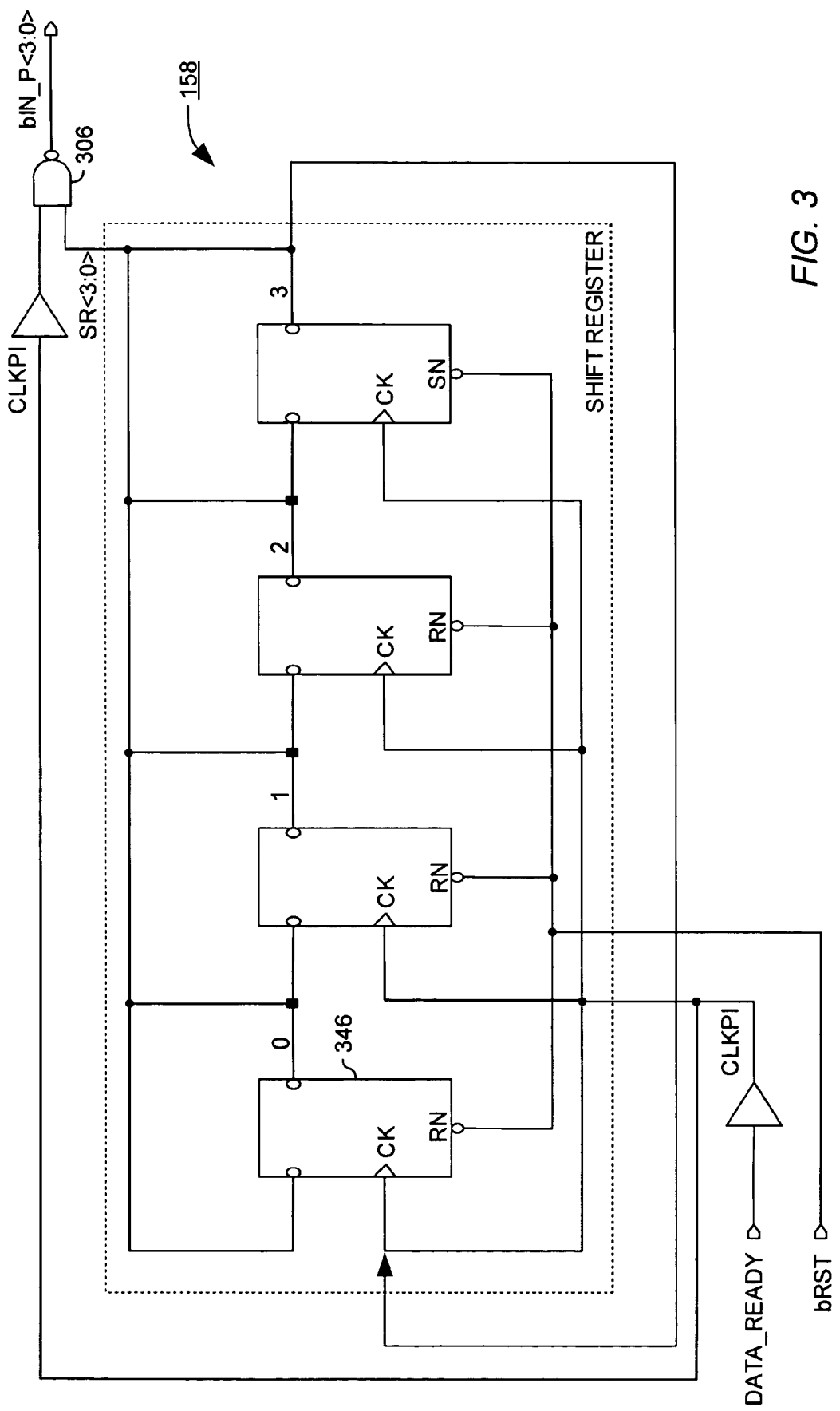
FIG. 3 illustrates an exemplary input pointer generation circuit in accordance with embodiments of the present invention.

As described above, because several bits of data (4 in this example) may be loaded into the FIFO in parallel, while the data is unloaded a single bit at a time, the input pointer signal may be changed more slowly than the output pointer signal, which may help increase signal integrity and maximize operating speed. As illustrated in FIG. 3, for some embodiments, this may be accomplished by utilizing a shift register 302 clocked with the DATA_READY signal. The output (SR<N>) of each shift register stage 304 may represent one bit in the input pointer signal (IP<N>). An AND gate 306 driven off the DATA_READY signal may ensure the input pointer signal width is the same width (e.g., a full clock period) as the DATA_READY signal, allowing ample time for signals to settle and be latched into the latching elements enabled by the input pointer signal.

Exemplary Timing Diagrams

Figure 4:
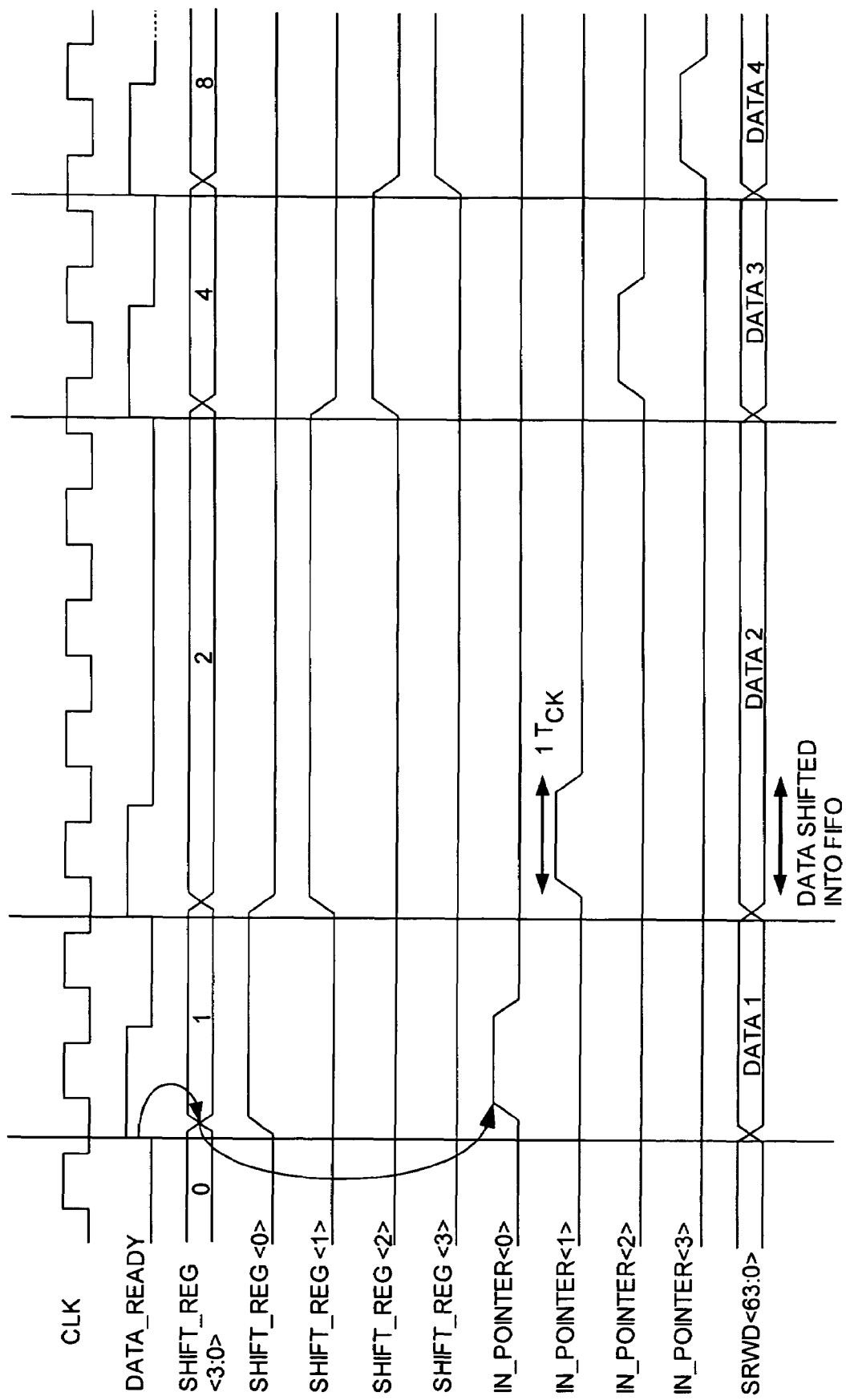
FIG. 4 is an exemplary timing diagram illustrating the generation of input pointers at an input stage of the FIFO structure of FIG. 2.

FIG. 4 illustrates an exemplary timing diagram of input pointer generation during a DRAM read access. As illustrated, a DATA_READY signal having a 1 clock cycle width may be generated at every second clock rising edge (for DDR-II DRAM) during the read access. As previously described, each array access may result in 64 new bits written onto SRWD lines from the arrays. Thus, assuming a x16 device and a burst length of 8 (BL8), 2 array accesses may be performed to read 128 bits.

As illustrated, the DATA_READY signal may be asserted with every new array access and corresponding change in SRWD lines. As a result, the shift register may be clocked, resulting in a new shift register value and corresponding input pointer value. As will be described in greater detail below, the input pointer signal may be used to switch pass gates, thereby coupling SRWD lines to selected latch elements to store multiple bits of data into the FIFO structure.

As an example, for the first read access illustrated in the timing diagram, the first bit in the input pointer (INP<0>) may be asserted, allowing four bits of data to be stored in four latch elements of the FIFO structure for each external data pad. For the next read access, the second bit in the input pointer (INP<1>) may be asserted, allowing another four bits of data to be stored in a different four latch elements of the FIFO structure. This process may be repeated during a subsequent burst access, using the last input pointer bit signals INP<2> and INP<3>. The shift register would then cycle around, such that a subsequent read access would again use the first input pointer bit signal.

Figure 5:
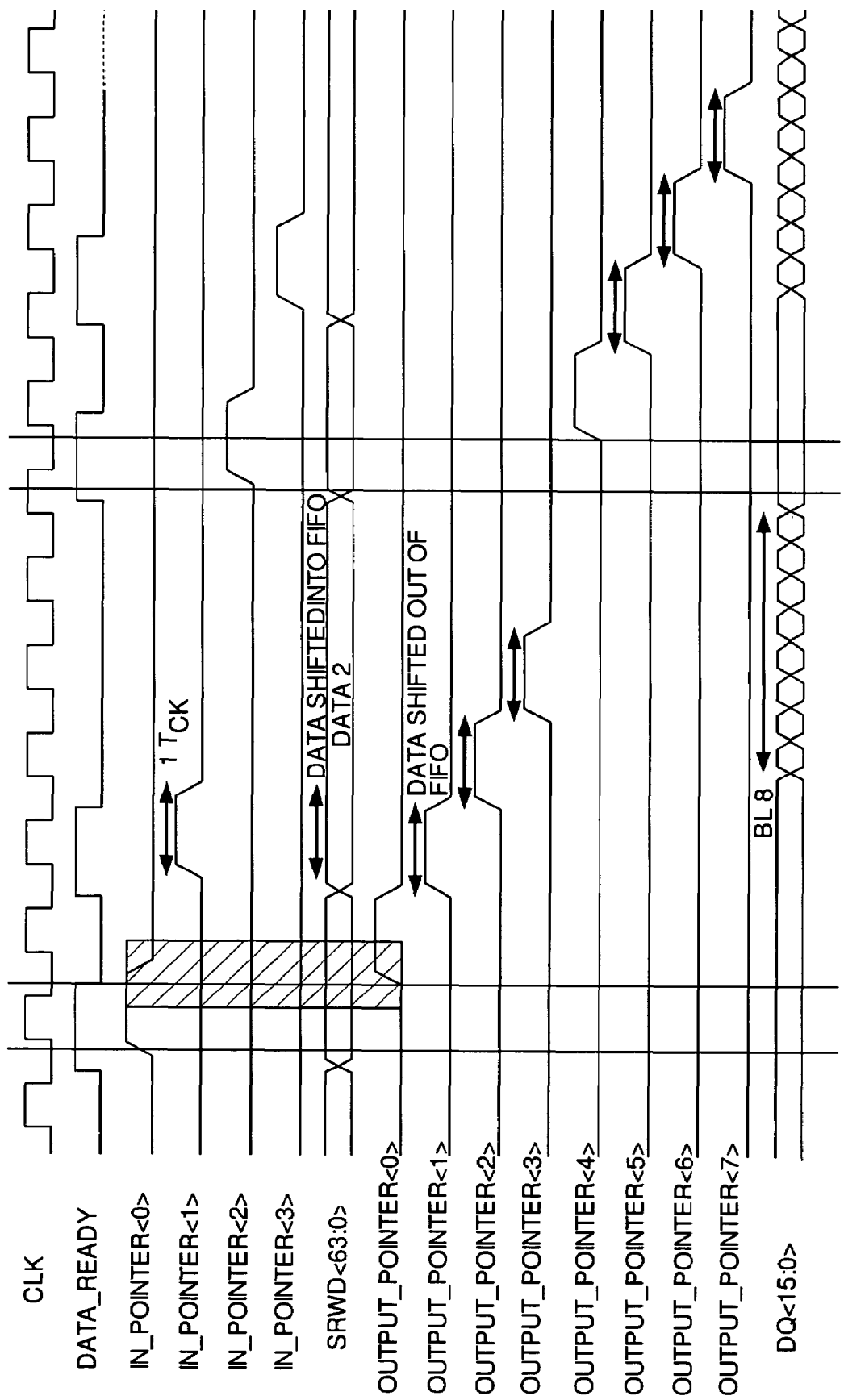
FIG. 5 is an exemplary timing diagram illustrating the relationship of generating input and output pointers for independently controlling input and output stages of the FIFO structure of FIG. 2.

As illustrated in FIG. 5, readout of the data loaded in conjunction with the input pointer signals may be unloaded independently, in conjunction with the output pointer signals. As illustrated by the cross-hatched area, as soon as the input pointer signals are generated on the rising edge of the DATA_READY signal, the data may be output in conjunction with the output pointer signals. For example, the four bits of data loaded into the FIFO in conjunction with the IN_P<0> may be unloaded in conjunction with output pointer signals OUT_P<0> and OUT_P<1>.

As illustrated, 2 bits of data, E1 and O1, may be output on rising and falling edges of the clock signal when OUT_P<0> is asserted, while another 2 bits of data, E2 and O2, may be output on rising and falling edges of the data clock signal (synchronized to the DQS signal) in a subsequent clock cycle when OUT_P<1> is asserted. The remaining four bits of the eight bit burst, may be unloaded in a similar manner, in conjunction with the output pointer signals OUT_P<2> and OUT_P<3>. A subsequent burst access (BL8) may be accomplished with the remaining output pointer signal bits OUT_P<7:4>.

An Exemplary Dual Frequency FIFO Structure

Figure 6:
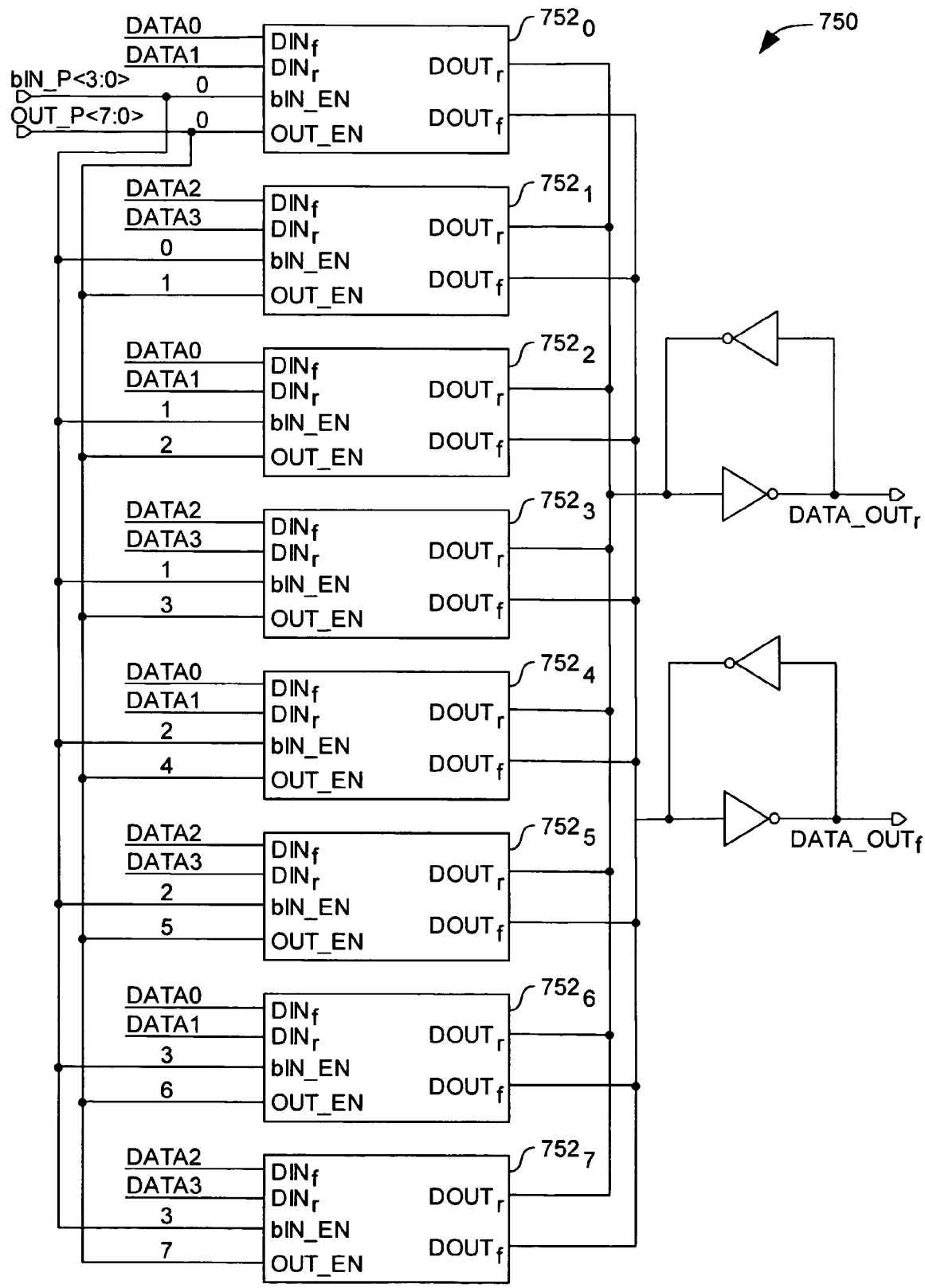
FIG. 6 is an exemplary schematic diagram of a FIFO structure in accordance with embodiments of the present invention.

FIG. 6 is an exemplary schematic diagram of a dual frequency FIFO structure 750 capable of operating in accordance with the timing diagrams of FIGS. 4 and 5. As illustrated, the FIFO structure 750 may be formed of individual FIFO cells 752. As an illustrative example, a FIFO structure with eight FIFO cells 752 (an "eight deep" FIFO) is shown, however any suitable number of FIFO cells may be used based on the requirements of a particular application. In general, the number of FIFO cells may be related to the number of bits transferred into the FIFO structure in each core clock cycle, to allow data from some number of cycles to be held in the FIFO structure. For the illustrated "eight-deep" structure shown, four bits of data are transferred in on each core clock cycle, with two bits held in each cell 752. Therefore, the eight cells shown are sufficient to hold data from four core read accesses.

As illustrated, each cell 752 is controlled by a single input pointer signal and a single output pointer signal, to load and unload two bits of data. In order to latch in four bits of data with each input pointer signal, each input pointer signal is used to control two cells 752. As an example, assuming 4 bits of data (DATA0–3) are loaded from SRWD lines in conjunction with the first input pointer signal (IP<0>), two bits of data (DATA0) and DATA1) will be loaded in a first cell $752_0$ controlled by IP<0>, while the remaining two bits of data (DATA2 and DATA3) will be loaded in a second cell $752_1$ controlled by IP<0>.

In contrast, each output pointer signal controls only one cell 752, to unload the two bits of data stored therein. As an example, the first output pointer signal (OP<0>) is used to unload the two bits of data (DATA0 and DATA1) from cell $752_0$ on rising and falling edges of the data clock signal (again, synchronized to the DQS signal), while the second output pointer signal (OP<1>) is used to unload the two bits of data (DATA2 and DATA3) from cell $752_1$ on rising and falling edges of a subsequent clock signal.

Figure 7:
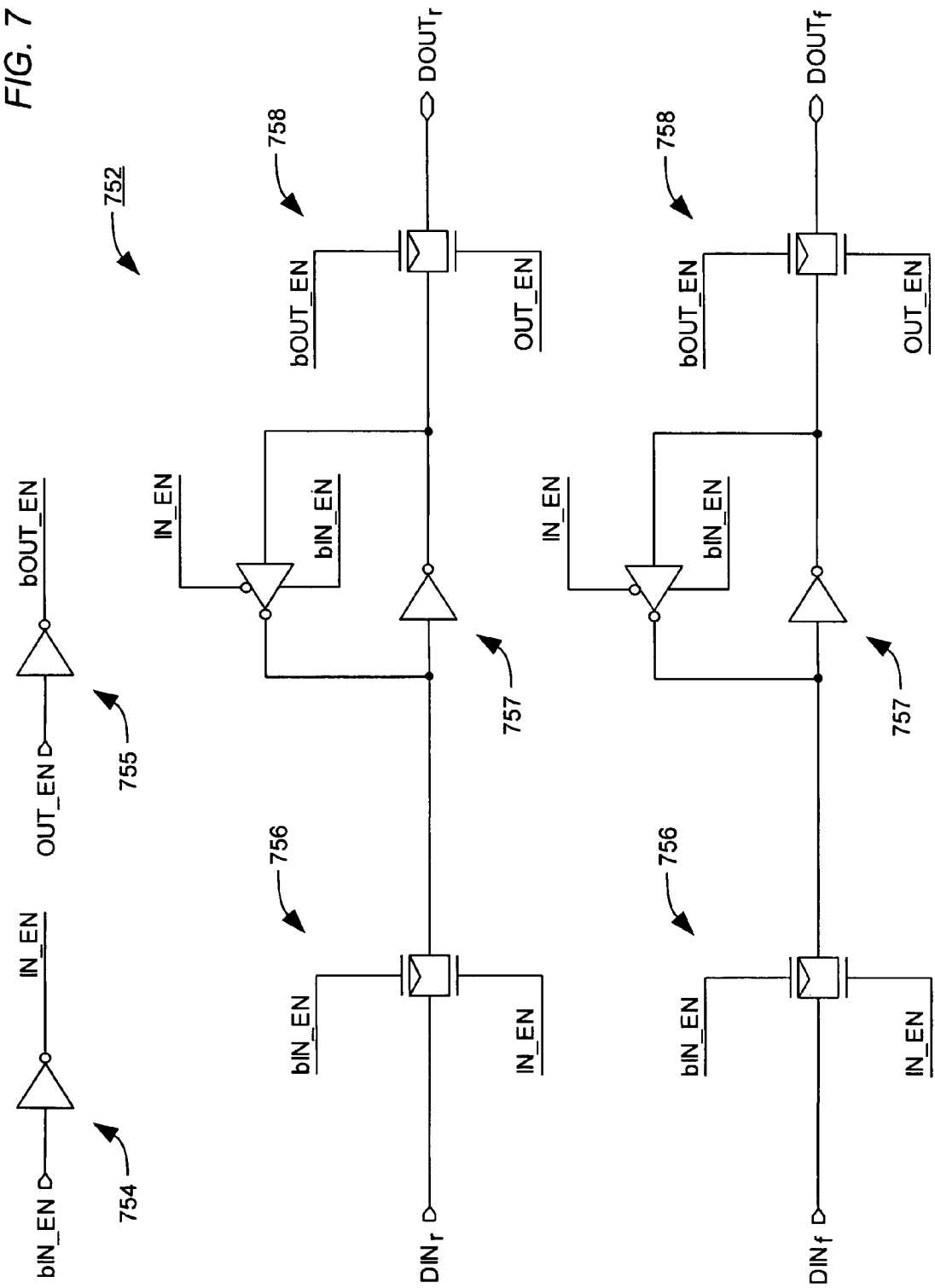
FIG. 7 is an exemplary schematic diagram of one cell of the FIFO structure of FIG. 6.

FIG. 7 is an exemplary schematic diagram of one FIFO cell 752 that accomplishes independent loading and unloading based on the input and output pointer signals. As illustrated, a first inverter 754 may be used to generate a complement of an input pointer signal to control input pass gates 756 to transfer incoming data signals (labeled DATAr and DATAf) to latch circuits 757. In a similar manner, a second inverter 755 may be used to generate a complement of the output pointer signal to control output pass gates 758 to transfer the latched data signals DATAr and DATA onto external data pads on rising and falling edges of a clock signal, respectively.

Figure 8A:
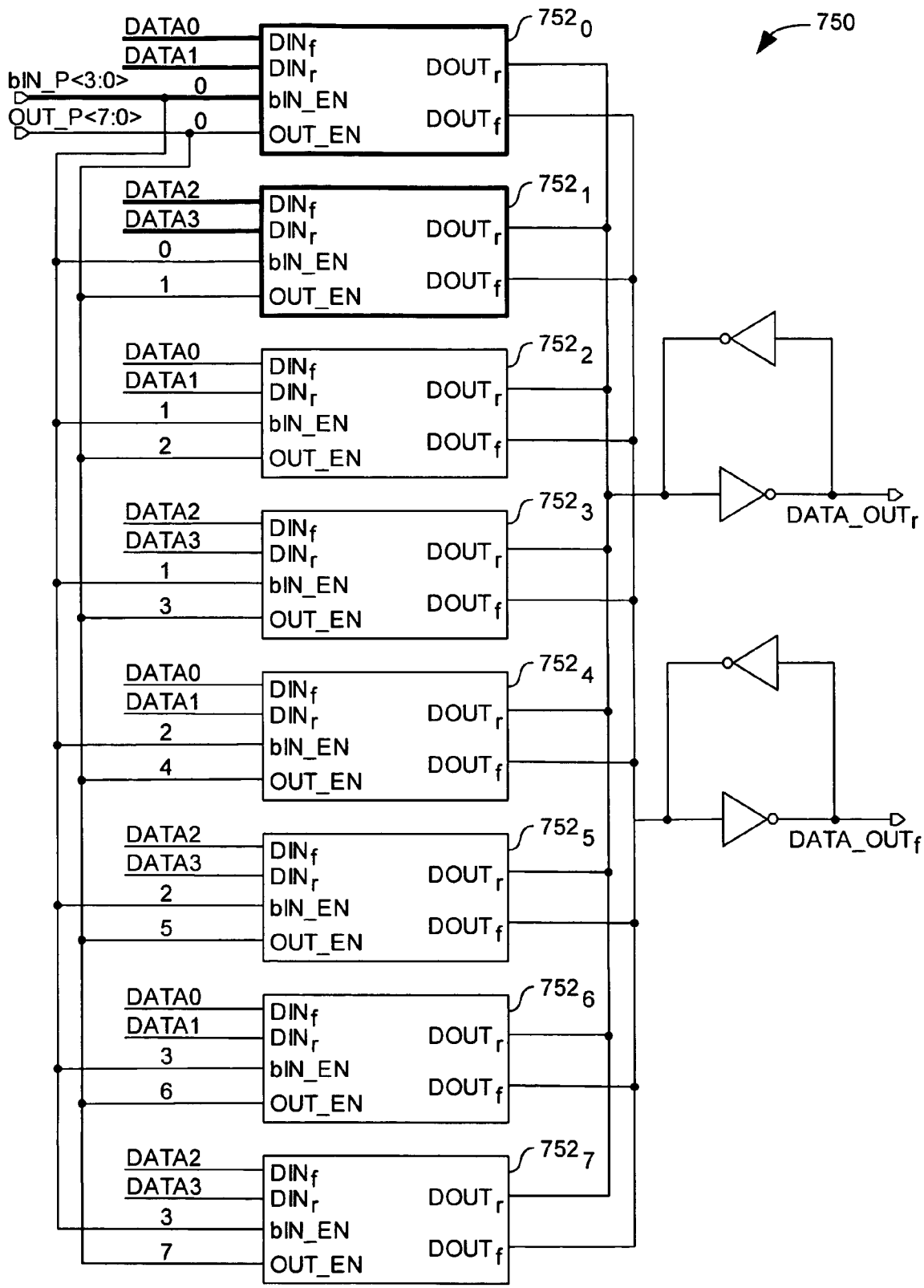
FIGS. 8A–8D illustrate how the FIFO structure of FIG. 6 may be independently loaded and unloaded at different frequencies.
Figure 8B:
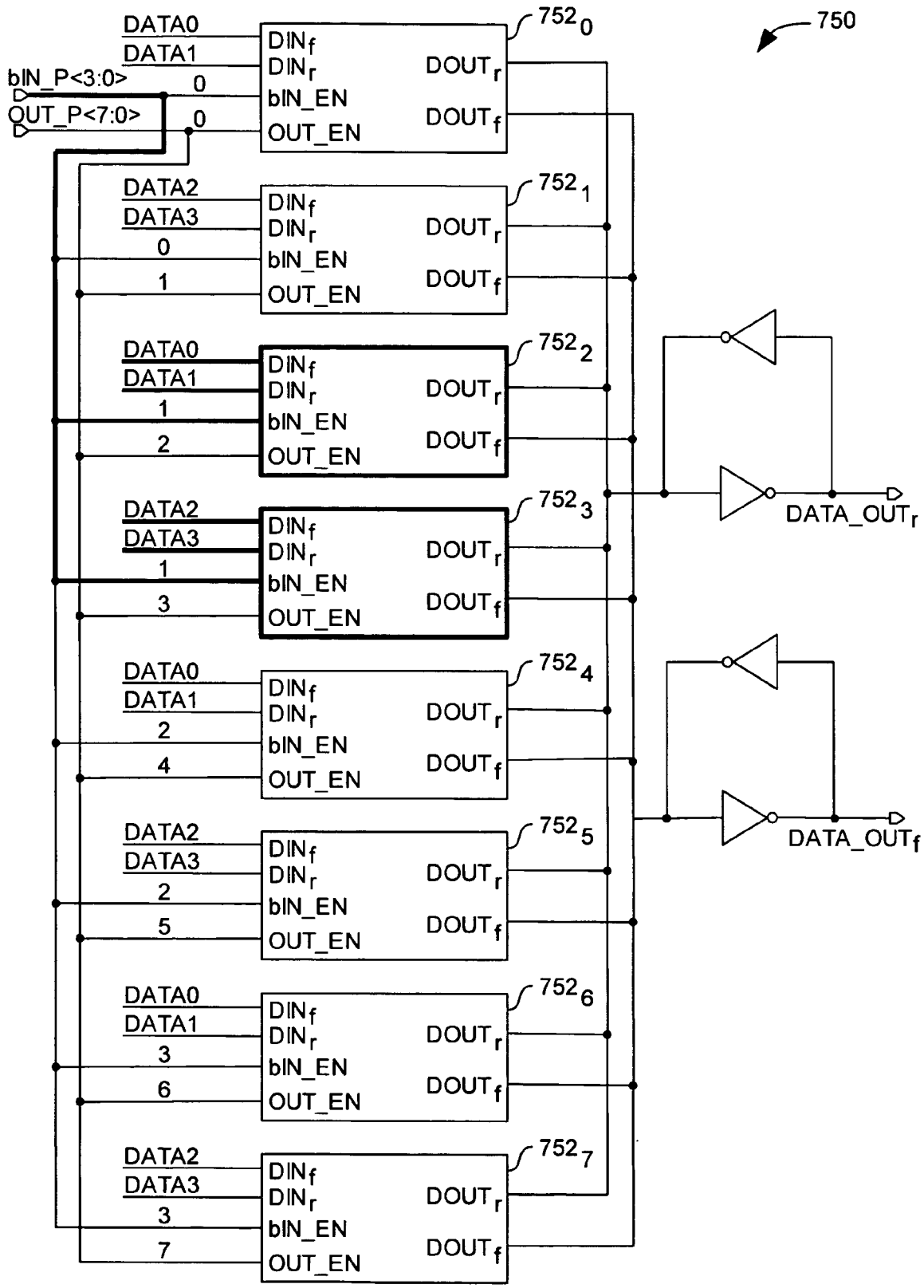

FIGS. 8A–8D illustrate the flow of data through the FIFO structure 750 during loading and unloading operations performed at different frequencies. As illustrated in FIG. 8A, in response to a first array access, and corresponding with assertion of the first input pointer signal IP<0> coinciding with the DATA_READY signal, two bits of data (DATA0 and DATA1) are loaded into the first cell $752_0$ and two bits of data (DATA2 and DATA3) are loaded into the second cell $752_0$. As illustrated in FIG. 8B, in response to a second array access, and corresponding with assertion of the second input pointer signal IP<1>, another two bits of data (DATA0 and DATA1) are loaded into a third cell $752_2$ and two bits of data (DATA2 and DATA3) are loaded into a fourth cell $752_3$.

Figure 8C:
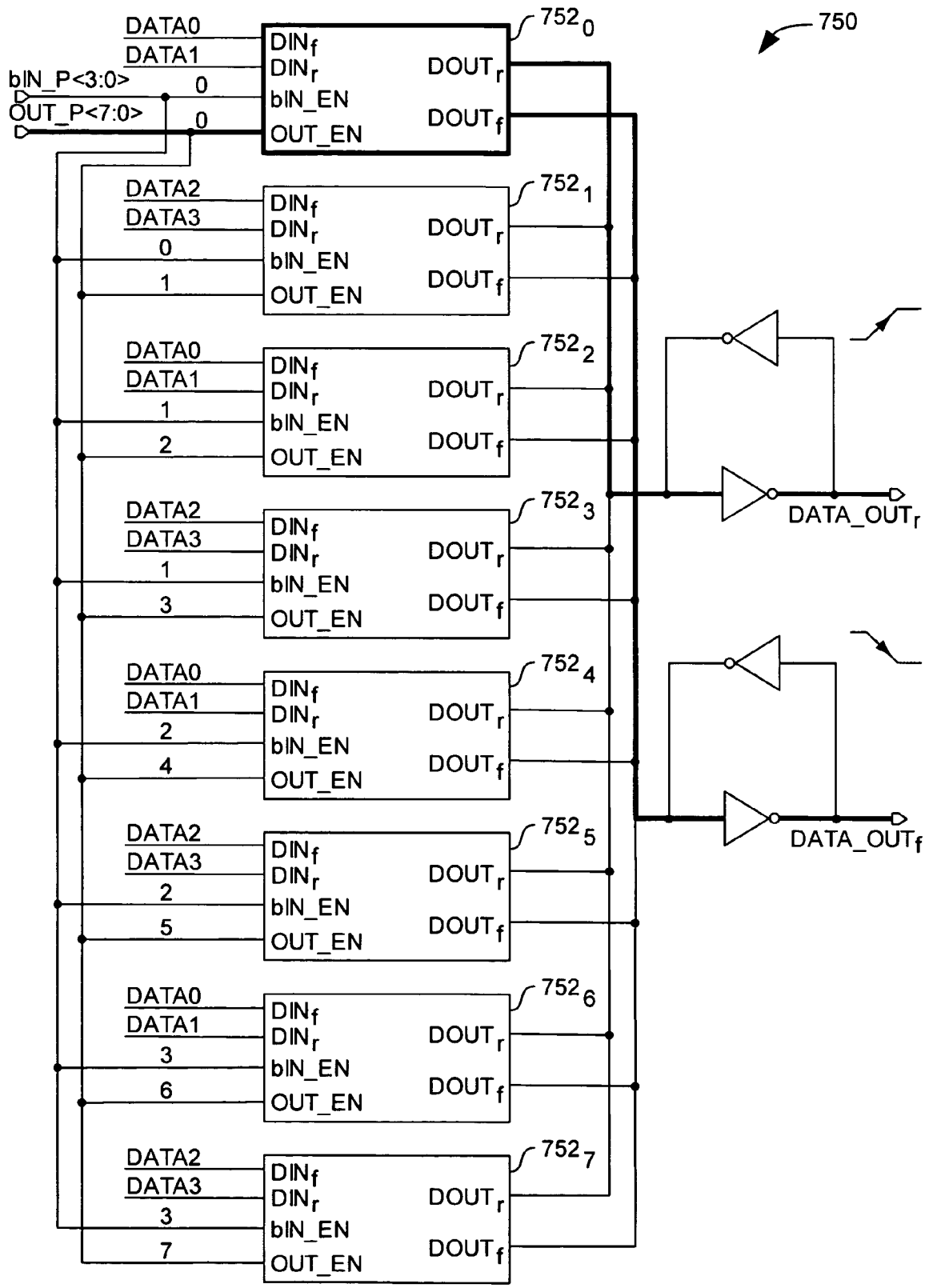
Figure 8D:
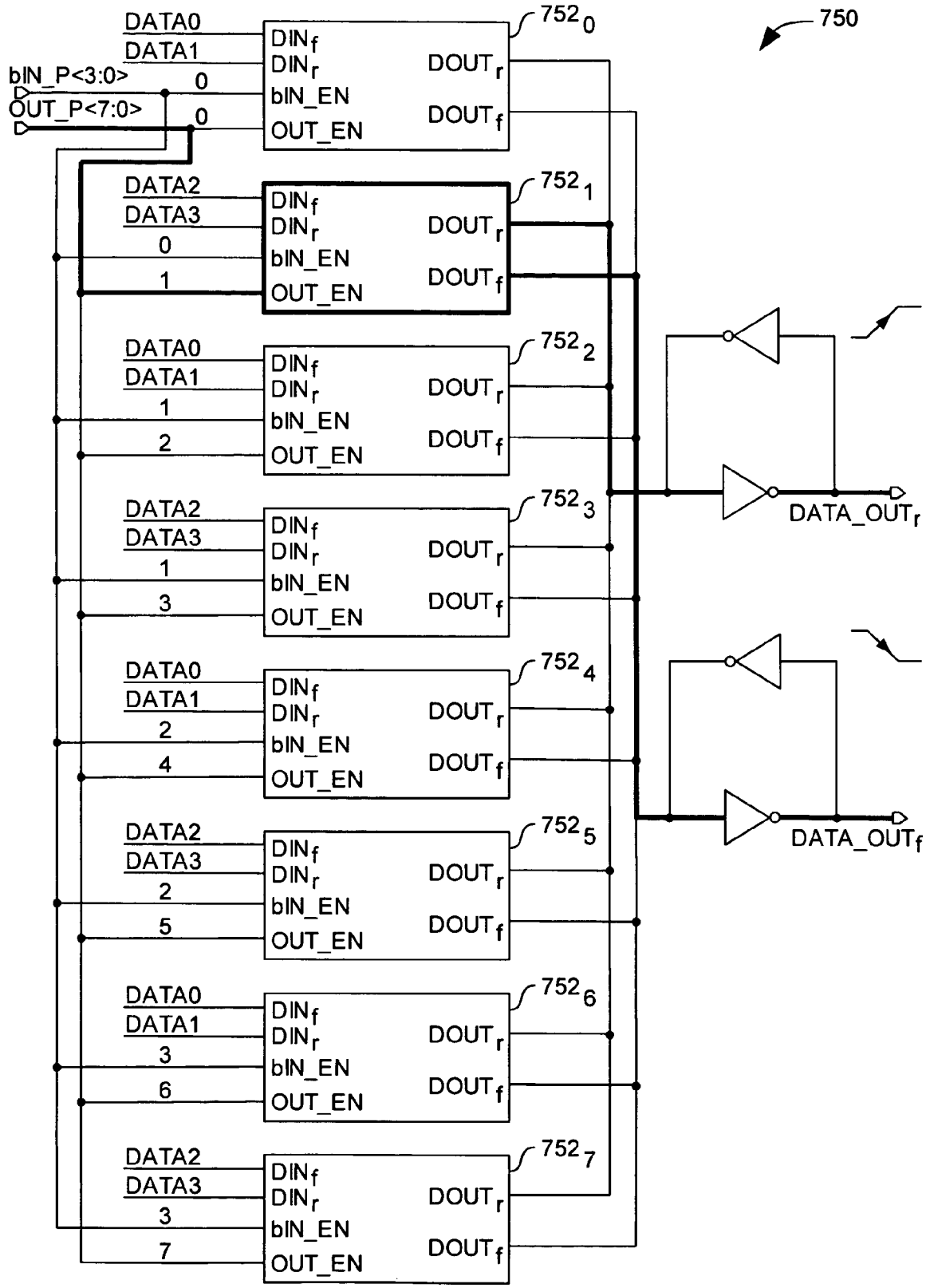

As illustrated in FIG. 8C, during actual readout, and corresponding with assertion of the first output pointer signal OP<0>, the first bit of data (DATA0) stored in the first cell $752_0$ is unloaded on a rising edge of the data clock signal, while the second bit of data (DATA1) stored in the first cell $752_0$ is unloaded on the falling edge of the data clock signal. As illustrated in FIG. 8D, in a subsequent clock cycle, and corresponding with assertion of the second output pointer signal OP<1>, the first bit of data (DATA2) stored in the second cell $752_1$ is unloaded on a rising edge of the data clock signal, while the second bit of data (DATA3) stored in the second cell $752_1$ is unloaded on the falling edge of the data clock signal. In a similar manner, the 4 bits of data loaded into the third and fourth cells $752_2$ and $752_3$ may be subsequently unloaded via the third and fourth output pointer signals OUT_P<2> and OUT_P<3>. In summary, the four bits of data transferred in on a single core access are output on rising and falling edges of two successive data clock signals.

CONCLUSION

By operating a FIFO structure used to transfer data from memory arrays to external data pads at separate frequencies, data may be loaded and unloaded independently. By loading multiple bits in parallel, loading may be performed at a much slower speed than unloading, thereby improving signal integrity. Further, by allowing unloading to occur as soon as data is available, latency may be reduced and maximum operating speeds may be achieved.

While the foregoing is directed to embodiments of the present invention, other and further embodiments of the invention may be devised without departing from the basic scope thereof, and the scope thereof is determined by the claims that follow.

What is claimed is:

1. A memory device, comprising:
   one or more memory arrays;
   external data pads; and
   for each external data pad, a first-in first-out (FIFO) structure having an input stage configured to transfer a plurality of bits of data in parallel from the memory arrays to a plurality of latch elements identified by an input pointer signal adjusted at a core frequency and an output stage configured to transfer bits of data sequentially from the latch elements identified by an output pointer signal adjusted at a data frequency that is at least twice the core frequency.

2. The memory device of claim 1, wherein the input pointer signal comprises a multi-bit signal adjusted in conjunction with a DATA_READY signal indicating new data from the memory arrays is available for transfer to the FIFO structure.

3. The memory device of claim 2, further comprising a shift register clocked by the DATA_READY signal, wherein the input pointer signal is derived from signals output from individual stages of the shift register.

4. The memory device of claim 1, wherein the data frequency is at least four times the core frequency.

5. The memory device of claim 1, wherein:
   at least 64 bits of data are accessed from the memory arrays during a read access; and
   at least four bits of data are transferred to each FIFO structure in parallel during a read access.

6. A dynamic random access memory (DRAM) device, comprising:
   one or more memory arrays;
   external data pads; and
   for each external data pad, a first-in first-out (FIFO) structure having an input stage configured to transfer a plurality of bits of data in parallel from the memory arrays to a plurality of latch elements in conjunction with a DATA_READY signal and an output stage configured to transfer at least one bit of data from the latch elements on each edge of a data clock signal.

7. The DRAM device of claim 6, wherein the output stage is configured to transfer at least two bits of data from the latch elements on each edge of the data clock signal.

8. The DRAM device of claim 6, wherein the DATA_READY signal is asserted for at least one data clock signal period in conjunction with each access of the memory arrays.

9. A dynamic random access memory (DRAM) device, comprising:
   one or more memory arrays;
   external data pads;
   for each external data pad, a first-in first-out (FIFO) structure having an input stage configured to transfer a plurality of bits of data in parallel from the memory arrays to a plurality of latch elements and an output stage configured to sequentially transfer at least one bit of data from the latch elements on each edge of a data clock signal to the external data pad;
   input pointer generation circuitry configured to generate, in conjunction with a DATA_READY signal an input pointer signal to determine the plurality of latch elements to which the input stage stores the plurality of bits of data in parallel; and
   output pointer generation circuitry configured to generate, in conjunction with the data clock signal an output pointer signal to determine the latch elements from which the output stage transfers the at least one bit of data.

10. The device of claim 9, wherein the input pointer generation circuitry comprises a shift register clocked by the DATA_READY signal.

11. The device of claim 9, wherein at least four bits of data are transferred from the memory arrays to the FIFO structure, in conjunction with each rising edge of the DATA_READY signal.

12. A method of operating a first-in first-out (FIFO) structure to transfer data from one or more memory arrays of a memory device to an external data pad of the memory device, comprising:
    transferring multiple bits of data from the memory arrays to the FIFO structure in parallel, in conjunction with a DATA_READY signal; and
    transferring multiple bits of data from the FIFO structure to the data pad, sequentially, in conjunction with a data clock signal, wherein the data clock signal has a corresponding frequency that is at least twice a corresponding frequency of the DATA_READY signal.

13. The method of claim 12, further comprising generating, in conjunction with the DATA_READY signal, an input pointer that identifies latch elements to store the multiple bits of data transferred to the FIFO structure from the memory arrays.

14. The method off claim 13, wherein:
    generating the input pointer comprises clocking a shift register with the DATA_READY signal; and
    bits of data in the input pointer correspond to outputs of individual stages in the shift register.

15. The method of claim 12, further comprising generating, in conjunction with the data clock signal, an output pointer that identifies latch elements of the FIFO structure from which bits of data are transferred to the external data pad.

16. The method off claim 15, wherein:
generating the output pointer comprises clocking a shift register with the data clock signal; and
bits of data in the output pointer correspond to outputs of individual stages in the shift register.

17. A method of operating a first-in first-out (FIFO) structure to transfer data from one or more memory arrays of a memory device to an external data pad of the memory device, comprising:
generating an input pointer in conjunction with a DATA_READY signal indicating data to be transferred from the memory arrays to the FIFO structure is available;
transferring multiple bits of data from the memory arrays to the FIFO structure in parallel, in conjunction with a DATA_READY signal, wherein the multiple bits of data transferred to the FIFO structure are stored in latch elements identified by the input pointer;
generating an output pointer in conjunction with a data clock signal; and
sequentially transferring multiple bits of data from the FIFO structure to the data pad in conjunction with the data clock signal, wherein the multiple bits of data transferred from the FIFO structure are transferred from latch elements identified by the output pointer.

18. The method of claim 17, wherein transferring multiple bits of data from the memory arrays to the FIFO structure in parallel comprise transferring at least four bits of data in parallel from the memory arrays to the FIFO structure.

19. The method of claim 18, wherein the data clock signal has a corresponding frequency at least twice that of a corresponding frequency of the DATA_READY signal.

20. The method off claim 17, wherein:
generating the input pointer comprises clocking a shift register with the DATA_READY signal; and
bits of data in the input pointer correspond to outputs of individual stages in the shift register.

21. A dynamic random access memory (DRAM) device, comprising:
one or more memory arrays;
external data pads; and
for each external data pad, data exchange means having an input stage configured to transfer a plurality of bits of data in parallel from the memory arrays to a plurality of latch means in conjunction with a DATA_READY signal and an output stage configured to transfer at least one bit of data from the latch means to a corresponding data pad on each edge of a data clock signal.

22. The device of claim 21, further comprising:
input pointer means for generating an input pointer in conjunction with the DATA_READY signal to identify latch means for storing the bits of data transferred from the memory arrays; and
output pointer means for generating an output pointer in conjunction with the data clock signal to identify latch means from which bits of data are transferred to the data pad.

23. The device of claim 21, wherein each latch means comprises:
at least one input transfer means controlled by a bit of the input pointer to transfer at least one bit of data into a latch element; and
at least one output transfer means controlled by a bit of the output pointer to transfer at least one bit of data out of a latch element.

24. The device of claim 23, wherein each latch means comprises:
at least a first output transfer means controlled by a first bit of the output pointer to transfer at least one bit of data out of a latch element to be driven onto an external data pad on a rising edge of the data clock signal; and
at least a second output transfer means controlled by the first bit of the output pointer to transfer at least one bit of data out of a latch element to be driven onto an external data pad on a falling edge of the data clock signal.

* * * * *